Nov. 15, 1960 A. E. BREWSTER ET AL 2,960,666

TRANSISTOR OSCILLATOR WITH IMPEDANCE TRANSFORMATION IN FEEDBACK CIRCUIT

Filed Feb. 10, 1955 2 Sheets-Sheet 1

Inventors
A. E. BREWSTER
P. E. GRAHAM
By Philip M. Bolton
Attorney

Nov. 15, 1960 A. E. BREWSTER ET AL 2,960,666

TRANSISTOR OSCILLATOR WITH IMPEDANCE TRANSFORMATION IN FEEDBACK CIRCUIT

Filed Feb. 10, 1955 2 Sheets-Sheet 2

Inventors
A. E. BREWSTER
P. E. GRAHAM
By Philip M. Bolton
Attorney 2,960,666
Patented Nov. 15, 1960

2,960,666

TRANSISTOR OSCILLATOR WITH IMPEDANCE TRANSFORMATION IN FEEDBACK CIRCUIT

Arthur Edward Brewster and Peter Ernest Graham, London, England, assignors to International Standard Electric Corporation, New York, N.Y.

Filed Feb. 10, 1955, Ser. No. 487,412

Claims priority, application Great Britain Mar. 19, 1954

14 Claims. (Cl. 331—109)

The present invention relates to electric oscillation generators of the kind in which the oscillating element is a semiconductor device.

The last few years have seen the development of amplifying devices employing semiconducting materials, known as crystal triodes or transistors, and it was obvious that a crystal triode could be adapted to generate oscillations somewhat on the same lines as thermionic valves. Accordingly some crystal triode oscillation circuits have already been proposed. However, the properties of crystal triodes are different from those of thermionic valves, and the oscillation circuits have to be suitably designed to produce satisfactory results.

The principal object of the present invention therefore is to provide an improved oscillation generator incorporating a crystal triode as the active element.

Since the gain and the internal impedances of a crystal triode are dependent on the operating currents, the amplitude of the generated oscillations is liable to be variable, and accordingly another object of the invention is to provide means for stabilizing this amplitude. Since, also, at the present time it is only possible to obtain crystal triodes which are manufactured to meet rather wide limits as regards performance characteristics, different samples are liable to produce different results in the same oscillation circuit. A further object of the invention, therefore, is to provide arrangements whereby substantially uniform results may be obtained with different samples of crystal triodes of a given type.

The principal object stated above is achieved according to the invention by providing an electric oscillation generator comprising a crystal triode having an emitter electrode, a collector electrode, and a base electrode, means for polarizing the emitter and collector electrodes with respect to the base electrode respectively in the low and high resistance directions of the corresponding contacts, a frequency determining device forming a feedback connection between the emitter and collector electrodes, means for introducing an impedance transformation between the said device and the emitter or collector circuit of the crystal triode, and means for deriving the generated oscillations from the collector circuit of the said crystal triode.

The invention will be described with reference to the accompanying drawings, in which.

Figure 3:
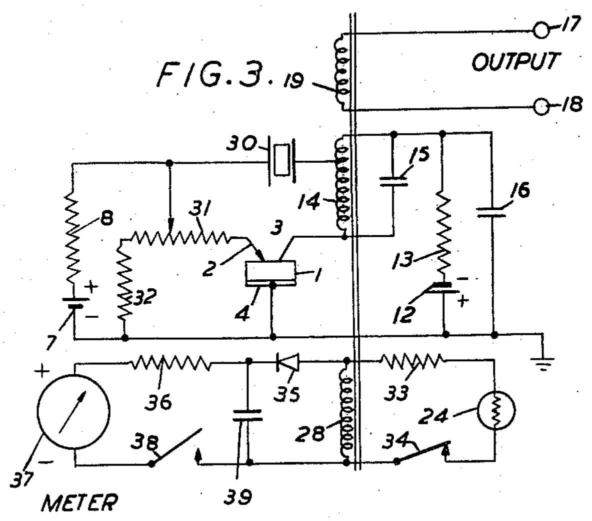
Figure 4:
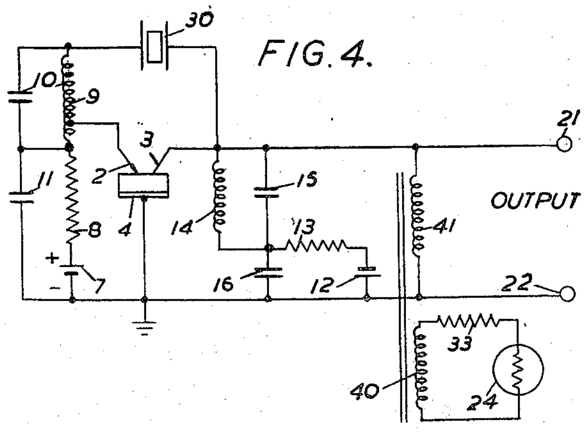

Fig. 3 shows another form of an oscillator circuit with an alternative arrangement for stabilizing the oscillation amplitude, and with means for adjusting the circuit to suit different samples of the crystal triode; and Fig. 4 shows a form of the oscillator according to the invention more especially suitable for relatively low frequencies, and provided with optional means for stabilizing the oscillation amplitude.

Figure 1:
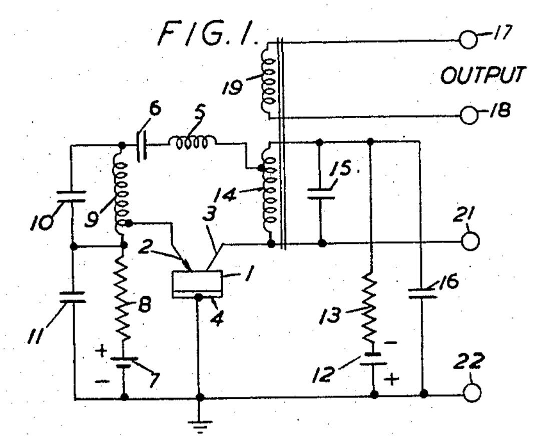
Fig. 1 shows a basic schematic circuit diagram of a crystal triode oscillation generator according to the invention.

Fig. 1 shows the basic oscillation circuit according to the invention. It comprises a crystal triode 1, having an emitter electrode 2, a collector electrode 3 and a base electrode 4. The emitter electrode is distinguished from the base electrode by an arrow-head. The oscillation frequency is determined by a suitable resonant device shown for example as an inductor 5 and a capacitor 6 connected in series between the collector and emitter circuits of the crystal triode. It will be understood that a suitable resonant electro-mechanical arrangement such as a piezo-electric crystal (not shown) could be used instead of the elements 5 and 6. It is well known that the circuit will have a much better frequency stability if a piezo-electric crystal is used instead of an inductor-capacitor resonant circuit.

Whatever resonant device is used for determining the frequency, it should behave like a series-resonant circuit, that is, a circuit whose impedance is a minimum at the resonance frequency.

It is assumed that the crystal triode 1 employs an N-type semiconductor, and so the emitter electrode 2 is positively polarized with respect to the base electrode, which is earthed, from an earthed direct current source 7 through a resistor 8, and through part of an inductor 9 forming with a capacitor 10 an input resonant load circuit, which should be tuned to the same frequency as the elements 5 and 6. A large by-pass capacitor 11 connects the junction point of elements 8 and 9 to ground.

The collector electrode 3 is negatively polarized with respect to the base electrode 4 by an earthed direct current source 12, through a resistor 13 and through an output parallel resonant load circuit comprising an inductor 14 and a capacitor 15 which should be tuned to the same frequency as the elements 5 and 6. A large by-pass capacitor 16 connects the junction point of elements 14 and 15 to ground. The generated oscillations are obtained from a pair of terminals 17, 18 connected to an output winding 19 inductively coupled to the inductor 14. Alternatively, the output may be taken from a terminal 21 directly connected to the collector electrode, and an earthed terminal 22. The resistor 13 may not always be necessary, but is included for limiting the collector current in case the collector circuit internal resistance is insufficient to limit the collector current to a safe value.

The resonant elements 5, 6 are shown connected between the upper end of the inductor 9 and a tapping point on the inductor 14. The latter connection provides a step-down transformation between the relatively high impedance of the collector circuit and that presented by the resonant elements 5, 6 which may be rather low at certain frequencies. Similarly the emitter electrode 2 is shown connected to the tapping point on the inductor 9. This connection is particularly useful at relatively low frequencies, (e.g. 5,000 cycles per second) when the elements 5, 6 are replaced by a piezo-electric crystal, because then the impedance of the emitter circuit is low compared with that presented by the piezo-electric crystal, and the connection shown provides a step-up impedance transformation between the emitter circuit and the piezo-electric crystal.

It will be understood, however, that although impedance transformations are shown at both ends of the resonant elements 5, 6, in order to illustrate the possibilities of the circuit, in practice both transformations will not be required together. Thus, in the circuits shown in Figs. 2 and 3 to be described below, no transformation is required for the emitter circuit, and accordingly elements 9 and 10 are not required, and the capacitor 6 (or the corresponding terminal of an equivalent resonant device) will be connected to the emitter electrode 2. Similarly in an alternative arrangement illustrated in Fig. 4, the elements 9 and 10 are retained, and the inductor 5 (or the equivalent device) is connected directly to the collector electrode 4. In this case the elements 14, 15 are used as a parallel resonant choke circuit in series with the source 12, and the output may be taken from terminals 21 and 22, the winding 19 not being required.

Figure 2:
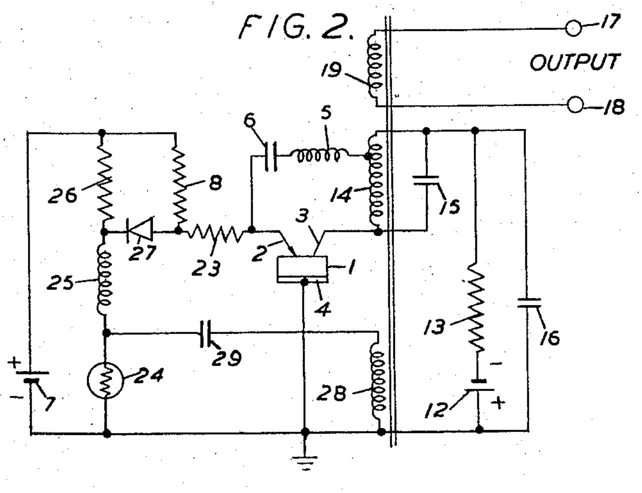
Fig. 2 shows an oscillator circuit with means for stabilizing the amplitude of the output oscillations.

The form of the basic circuit shown in Fig. 2 includes means for stabilizing the oscillation amplitude. The amplitude of the oscillations increases with increase of the emitter direct current and vice versa and this provides a convenient basis for stabilizing the amplitude.

In Fig. 2 (and also in Figs. 3 and 4 to be described later) those elements which are the same as elements in Fig. 1 are given the same designation numerals. The emitter electrode 2 is connected to resistor 8 through an additional resistor 23. Connected in series across the source 7 are a directly heated thermistor 24 (connected to ground), an inductor 25 and a resistor 26. A rectifier 27 connects the junction point of elements 25 and 26 with the junction point of elements 8 and 23, and is directed so that it will be blocked when the latter junction point is at the lower potential. A winding 28 inductively coupled with the inductor 14 is connected across the thermistor 24, a blocking capacitor 29 being included in the connection. It is assumed that the thermistor 24 is of the conventional type having a negative temperature coefficient of resistance. The generated oscillations are applied through the capacitor 29 to heat the thermistor 24, which will have a relatively high resistance when the oscillation amplitude is small. The resistor 26 is so chosen that the rectifier 27 is blocked in this condition, so that the current supplied by the source 7 to the emitter electrode through the resistor 8 is unaffected by the shunt circuit of elements 24, 25 and 26. As the oscillation amplitude increases, the resistance of the thermistor 24 decreases until presently the rectifier 27 becomes unblocked. As the oscillation amplitude increases further, an increasing amount of the emitter current is shunted through the rectifier 27 and elements 24 and 25 until the reduction in gain of the crystal triode which results from the reduction in the emitter current presently arrests any further increase in amplitude, which then becomes stabilized. Any subsequent tendency for the amplitude to increase or decrease will produce a corresponding decrease or increase in the thermistor resistance, which in turn produces a change in the emitter current which counteracts the change in amplitude.

The inductor 25 is provided as a choke to keep the oscillations out of the direct current supply circuit, and the capacitor 29 is provided to prevent direct current from being shunted through the winding 28.

In order that the circuit shall operate satisfactorily, the resistor 26 should be much larger than the resistor 8.

The rectifier 27 and resistor 26 are provided to prevent the stabilizing control from operating until the oscillation amplitude has reached a certain minimum value. This arrangement is generally necessary if the crystal triode has a low current gain, for otherwise the oscillations may never reach the desired amplitude. If the crystal triode has a high current gain, this trouble does not arise, and elements 26 and 27 can then be omitted, the upper terminal of the inductor 25 then being connected directly to the junction point of elements 8 and 23.

Fig. 3 shows an oscillator with a basic circuit similar to that of Fig. 2 but with an alternative stabilizing arrangement, and with means for adjusting the emitter current for different samples of the crystal triode, in order that a substantially sinusoidal output wave may always be obtained.

In Fig. 3, the element which determines the frequency is shown as a piezo-electric crystal 30 which takes the place of the elements 5, 6 shown in Fig. 2. The emitter electrode is connected to ground through a potentiometer 31 and a resistor 32 connected in series, and the resistor 8 and crystal 30 are connected to the movable contact of the potentiometer, as shown.

The thermistor 24 is connected in series with a resistor 33 and a switch 34 to the terminals of the winding 28. Thus the thermistor is not associated with the emitter current supply circuit as in Fig. 2. Across the winding 28 there is also connected a simple rectifying circuit for measuring the level of the generated oscillations, consisting of a rectifier 35, a resistor 36, a direct current measuring instrument or meter 37, and a switch 38 all connected in series, and a shunt capacitor 39.

When in normal operation, the switch 34 is closed and the switch 38 is open, as shown. By this arrangement the series impedance of the thermistor 24 and resistor 33 is effectively connected across the resonant circuit 14, 15 but transformed in accordance with the impedance transformation ratio of the windings 14 and 28. It is well known that the value of the resistor 33 may be so chosen in relation to the impedance characteristic of the thermistor 24, that the voltage across the two elements is very nearly independent of the current which flows through them over a relatively large range of currents. Thus it will be seen that when the output oscillations have reached a level corresponding to the lower end of this range of currents, the output oscillation voltage across winding 14 or 19 will thereafter be held substantially constant by the thermistor circuit, any further increase in oscillation power being absorbed by the thermistor. This arrangement therefore stabilizes the oscillation output voltage against variations due to any cause, over a certain range of power of the generated oscillations.

The function of the potentiometer 31 will now be explained. Owing to the variations in characteristics which are liable to occur between different samples of the same type of crystal triode, rather widely different values of emitter bias current are required to obtain maximum oscillation amplitude without producing a bad waveform. The oscillations fed back through the crystal 30 are rectified by the emitter contact and increase the emitter bias current. If the feedback voltage is too large, the collector current is driven to cut off during each period of the oscillations, and the positive loops of the collector output wave are flattened. It will be seen that if the movable contact of the potentiometer 31 is moved away from the emitter electrode 2, the emitter current supplied from the source 7 is reduced, and at the same time the feedback voltage supplied to the emitter electrode 2 is also reduced. It is found that as the movable contact of the potentiometer 31 is moved away from the emitter electrode 2, the width of the flat portion of the positive loops of the collector output wave is progressively reduced without at the same time reducing the peak amplitude, until a substantially sinusoidal form is produced. Accordingly, in order to adjust the potentiometer 31 for any given sample of crystal triode 1, the switch 34 is opened to disconnect the thermistor circuit, and the switch 38 is closed to connect the meter 37, which then gives a reading which is a measure of the output level of the generated oscillations. Starting with the movable contact of the potentiometer 31 at the emitter electrode end, it is steadily moved away from the emitter electrode. At first the meter 37 indicates no change in level, but after the point corresponding to the sinusoidal waveform is reached, the meter reading starts to decrease. The required adjustment of the potentiometer 31 is the point at which the meter reading just begins to decrease. The switch 38 is then opened again, and the switch 34 is closed to reconnect the stabilizing circuit.

It may be useful to mention that in a particular case of an oscillator constructed according to Fig. 3, in which the crystal 30 was tuned to 250 kilocycles per second, the sources 7 and 12 had potentials of 60 volts, and the resistances of elements 8, 31 and 32 were 56,000 ohms, 1,000 ohms and 220 ohms respectively. The total external load impedance presented to the collector circuit was arranged to be about 8,000 ohms.

It may be pointed out that in principle the elements 24 and 33 could have been connected directly across the winding 14 or 19, but in practice they will generally be found to load the output of the oscillator too heavily. It is better therefore to connect them to a separate winding (28) which can be chosen so that this difficulty is avoided. Similar considerations hold, of course, in the case of Fig. 2.

Fig. 4 shows a simple form of the Fig. 1 circuit suitable particularly for rather low frequencies. Again, the frequency control element is shown as a piezo-electric crystal 30, tuned in this case to 5 kilocycles per second, for example, and the circuit includes the elements 9, 10 and 11 of Fig. 1. The crystal 30 is connected between the collector electrode 3 and the upper end of the inductor 9, and the parallel resonant circuit formed by elements 14 and 15 is connected in series between the collector electrode 3 and the resistor 13. There is thus no impedance transformation between the collector circuit and the crystal 30. The emitter electrode is connected to a tapping point on the inductor 9. Since the low frequency crystal 30 is likely to have rather a high impedance at resonance, a matching transformation is provided in this way between the impedance presented by the circuit of the piezo-electric crystal 30 and the emitter circuit impedance. The oscillation output is taken from the terminal 21 connected to the collector electrode 3 and the ground terminal 22.

Fig. 4 also includes amplitude stabilizing arrangements similar to those shown in Fig. 3, and comprising elements 24 and 33, without the switch 34, connected to a winding 40 inductively coupled to a winding 41 connected between terminals 21 and 22. Elements 24, 33, 40 and 41 may evidently be omitted if stabilization is not required. Clearly also arrangements for adjusting the output waveform on the lines described with reference to Fig. 3 may be included if required.

It has been assumed above that the crystal triode employed in the embodiments illustrated in Figs. 1 to 4 is of the kind requiring the emitter and collector electrodes to be polarized positively and negatively, respectively, to the base electrode. If the opposite kind of crystal triode is used, the sources 7 and 12, and the rectifier 27 (Fig. 2), should be reversed. The crystal triode need not be of the cat whisker type illustrated in the figures, but could be of the junction type. Whatever type is used, the emitter electrode should be polarized in the conducting or low resistance direction of the emitter contact, while the collector electrode should be polarized in the non-conducting or high resistance direction of the collector contact.

While the principles of the invention have been described above in connection with specific embodiments, and particular modifications thereof, it is to be clearly understood that this description is made only by way of example and not as a limitation on the scope of the invention.

What we claim is:

1. An electric oscillation generator comprising: a transistor having an emitter electrode, a collector electrode and a base electrode; means for polarizing the emitter and collector electrodes in the low and high resistance directions respectively with respect to the base electrode; a parallel resonant circuit effectively connected between said base electrode and one of the remaining transistor electrodes; a positive feedback frequency determining device connected between said emitter and collector electrodes through at least a portion of said resonant circuit; means for introducing an impedance transformation between said device and said resonant circuit and means for deriving oscillations from said generator.

2. An electric oscillation generator according to claim 1 wherein said parallel resonant circuit is connected between said collector and base electrodes and is tuned to the same frequency as said frequency determining device.

3. A generator according to claim 1 wherein said parallel resonant circuit is connected between said emitter and base electrodes and is tuned to the same frequency as said frequency determining device.

4. An electric oscillation generator according to claim 1 including circuit means for stabilizing the amplitude of the electric oscillations comprising means for varying the emitter electrode polarizing potential inversely with changes in the amplitude of said oscillations, said varying means including a thermistor in shunt with said polarizing means and in series with said emitter electrode.

5. A generator according to claim 2 including control means for simultaneously adjusting the emitter polarizing current and the oscillation voltage fed back to the emitter electrode in order to obtain a maximum power for the generated oscillations while generating a substantially sinusoidal wave.

6. A generator according to claim 5 wherein said control means comprises an adjustable potentiometer connected between the said emitter and base electrodes, a polarizing source for the emitter electrode having one terminal connected to the said base electrode and the other terminal connected to the movable contact of the said potentiometer, and said frequency determining device connected to said movable contact.

7. A generator according to claim 6 further including means for measuring the amplitude of the generated oscillations.

8. A generator according to claim 6, including means for stabilizing the amplitude of the generated oscillations comprising a variable load impedance connected effectively in shunt with said load circuit and including a thermistor and a resistor, said resistor having a resistance value such that the voltage across the load impedance is maintained substantially constant.

9. A generator according to claim 8 wherein said load impedance is connected across a winding inductively coupled with the said inductor.

10. A generator according to claim 2 further comprising stabilizing means including a thermistor controlled by the generated oscillations for varying the emitter polarizing current in such manner as to substantially stabilize the amplitude of the generated oscillations.

11. A generator according to claim 10 wherein said stabilizing means includes means for preventing any change in the emitter polarizing current unless the amplitude of the generated oscillations exceeds a given minimum value.

12. A generator according to claim 10 wherein the emitter polarizing current is derived from a source having one terminal connected to the said base electrode and the other terminal connected through a resistor to the said emitter electrode, said thermistor being connected between the said base electrode and an intermediate point on the said resistor, and means for supplying control current to the said thermistor from a winding inductively coupled to the said output load circuit.

13. A generator according to claim 12 in which said thermistor is connected to said intermediate point through a rectifier and to the said source through a resistor, said rectifier being so connected that it will be in the blocking condition until the amplitude of the oscillations exceeds the given minimum value.

14. A generator according to claim 2 in which the said frequency determining device comprises a piezo-electric crystal.

References Cited in the file of this patent

UNITED STATES PATENTS 2,663,766 Meacham ______________ Dec. 22, 1953

(Other references on following page)

UNITED STATES PATENTS

| | | |
|---|---|---|
| 2,681,996 | Wallace | June 22, 1954 |
| 2,692,337 | Hanson | Oct. 19, 1954 |
| 2,727,993 | Epstein | Dec. 20, 1955 |
| 2,729,708 | Goodrich | Jan. 3, 1956 |
| 2,768,296 | Herzog | Oct. 23, 1956 |
| 2,802,065 | Sziklai | Aug. 6, 1957 |
| 2,809,239 | Nielsen | Oct. 8, 1957 |
| 2,855,568 | Lin | Oct. 7, 1958 |
| 2,886,653 | Lin | May 12, 1959 |